US009746532B2

(12) United States Patent
Umeda et al.

(10) Patent No.: US 9,746,532 B2
(45) Date of Patent: Aug. 29, 2017

(54) MAGNETIC RESONANCE IMAGING APPARATUS

(71) Applicant: TOSHIBA MEDICAL SYSTEMS CORPORATION, Otawara-Shi, Tochigi-Ken (JP)

(72) Inventors: Masaaki Umeda, Sakura (JP); Takahiro Ishihara, Otawara (JP)

(73) Assignee: TOSHIBA MEDICAL SYSTEMS CORPORATION, Otawara-Shi, Tochigi-Ken (JP)

( * ) Notice: Subject to any disclaimer, the term of this patent is extended or adjusted under 35 U.S.C. 154(b) by 885 days.

(21) Appl. No.: 14/043,225

(22) Filed: Oct. 1, 2013

(65) Prior Publication Data

US 2014/0055140 A1    Feb. 27, 2014

Related U.S. Application Data

(63) Continuation of application No. 12/953,931, filed on Nov. 24, 2010, now Pat. No. 8,643,364.

(30) Foreign Application Priority Data

Nov. 26, 2009  (JP) .................... 2009-269210
Nov. 17, 2010  (JP) .................... 2010-256379

(51) Int. Cl.
*G01V 3/00*      (2006.01)
*G01R 33/36*     (2006.01)
*G01R 33/565*    (2006.01)
*G01R 33/24*     (2006.01)
*G01R 33/561*    (2006.01)

(52) U.S. Cl.
CPC ...... *G01R 33/3628* (2013.01); *G01R 33/3678* (2013.01); *G01R 33/5659* (2013.01); *G01R 33/246* (2013.01); *G01R 33/5612* (2013.01)

(58) Field of Classification Search
CPC ............ G01R 33/3628; G01R 33/3678; G01R 33/5659
See application file for complete search history.

(56) References Cited

U.S. PATENT DOCUMENTS 8,581,585 B2    11/2013  Arai
2005/0073304 A1  4/2005  Feiweier et al.
2008/0265889 A1  10/2008  Zhai et al.
(Continued)

FOREIGN PATENT DOCUMENTS

JP    H05(1993)-023315    2/1993
JP    2008-5141259        5/2008
(Continued)

OTHER PUBLICATIONS

Japanese Office Action dated Apr. 8, 2014 in JP2010-256379.

*Primary Examiner* — Daniel Miller
(74) *Attorney, Agent, or Firm* — Nixon & Vanderhye P.C.

(57) ABSTRACT

A magnetic resonance imaging apparatus includes an imaging unit configured to carry out magnetic resonance imaging of a patient using a transmitting QD coil that allows at least one of phase and amplitude of a radio-frequency transmit pulse on at least one input channel of the transmitting QD coil to be adjusted independently of each other, and an adjustment unit arranged to adjust at least one of the phase and the amplitude of the radio-frequency transmit pulse according to imaging conditions.

24 Claims, 13 Drawing Sheets

(56) References Cited

U.S. PATENT DOCUMENTS

2009/0137896 A1* 5/2009 Harvey .............. G01R 33/5659
  600/410
2009/0322330 A1 12/2009 Adachi et al.
2012/0161766 A1 6/2012 Harvey et al.

FOREIGN PATENT DOCUMENTS

WO 2006/033047 3/2006
WO 2009/101871 8/2009

* cited by examiner

EXAMPLE OF PHASE-AMPLITUDE LOOK UP TABLE

| | | PHASE $\phi 2$ (DEG) | GAIN (AMPLITUDE) G2 (dB) | GAIN CORRECTION $\Delta G$ (dB) BASED ON WEIGHT (WHEN WEIGHT>80KG) |
|---|---|---|---|---|
| IMAGING REGION | HEAD | 140 | 3 | 0 |
| | ABDOMEN | 150 | 5 | 3 |
| | WRIST | 80 | 4 | 0 |
| COIL TYPE | PHASED ARRAY HEAD COIL | 140 | 3 | 0 |
| | T/R HEAD COIL | 140 | 3 | 0 |
| | TORSO COIL | 150 | 5 | 4 |
| | WRIST COIL | 80 | 4 | 0 |

FIG. 4

MAGNETIC RESONANCE IMAGING APPARATUS

CROSS-REFERENCE TO RELATED APPLICATIONS

This application is a continuation of copending application Ser. No. 12/953,931 filed Nov. 24, 2010, which is based upon and claims the benefit of priority from Japanese Patent Applications No. 2009-269210 filed on Nov. 26, 2009, and No. 2010-256379 filed on Nov. 17, 2010, the entire contents of all of which are incorporated herein by reference.

FIELD

Embodiments described herein relate generally to a magnetic resonance imaging apparatus.

BACKGROUND

Magnetic resonance imaging (MRI) is an imaging method which magnetically excites nuclear spins of a patient placed in a static magnetic field with an RF signal at the Larmor frequency to reconstruct an image using an NMR (nuclear magnetic resonance) signal resulting from the excitation.

In magnetic resonance imaging, when frequency of a transmitted RF pulse increases, an RF magnetic field in the patient becomes non-uniform. The non-uniformity of the RF magnetic field is also referred to as B1 non-uniformity. Thus, it is important to correct the B1 non-uniformity.

For example, a B1 correction method has been proposed which determines amplitude and phase of an RF transmit pulse based on aspect ratio. Also, a method is known which collects a B1 map by changing the amplitude and phase of an RF transmit pulse and thereby determines the amplitude and phase of the RF transmit pulse.

However, an MRI apparatus with high magnetic field strength have come to be developed recently. Consequently, the frequency of RF pulses has become greater, making it difficult to resolve the B1 non-uniformity even if an RF pulse is transmitted using the amplitude and phase determined based on aspect ratio as is conventionally the case. On the other hand, when collecting a B1 map by changing the amplitude and phase of an RF pulse as is conventionally the case, there are problems of increased imaging time and difficulty to determine B1 non-uniformity.

Thus, there is demand for a magnetic resonance imaging apparatus which can further improve B1 uniformity in a simple way.

BRIEF DESCRIPTION OF THE DRAWINGS

FIG. 4 is a diagram showing an example of a phase-amplitude look-up table;

SUMMARY

An embodiment of a magnetic resonance imaging apparatus will be described with reference to the accompanying drawings. The magnetic resonance imaging apparatus according to the embodiment includes an imaging unit configured to carry out magnetic resonance imaging of a patient using a transmitting QD coil which allows at least one of phase and amplitude of a radio-frequency transmit pulse on at least one input channel of the transmitting QD coil to be adjusted independently of each other, and an adjustment unit configured to adjust at least one of the phase and the amplitude of the radio-frequency transmit pulse according to imaging conditions.

(Configuration and Functionality)

Figure 1:
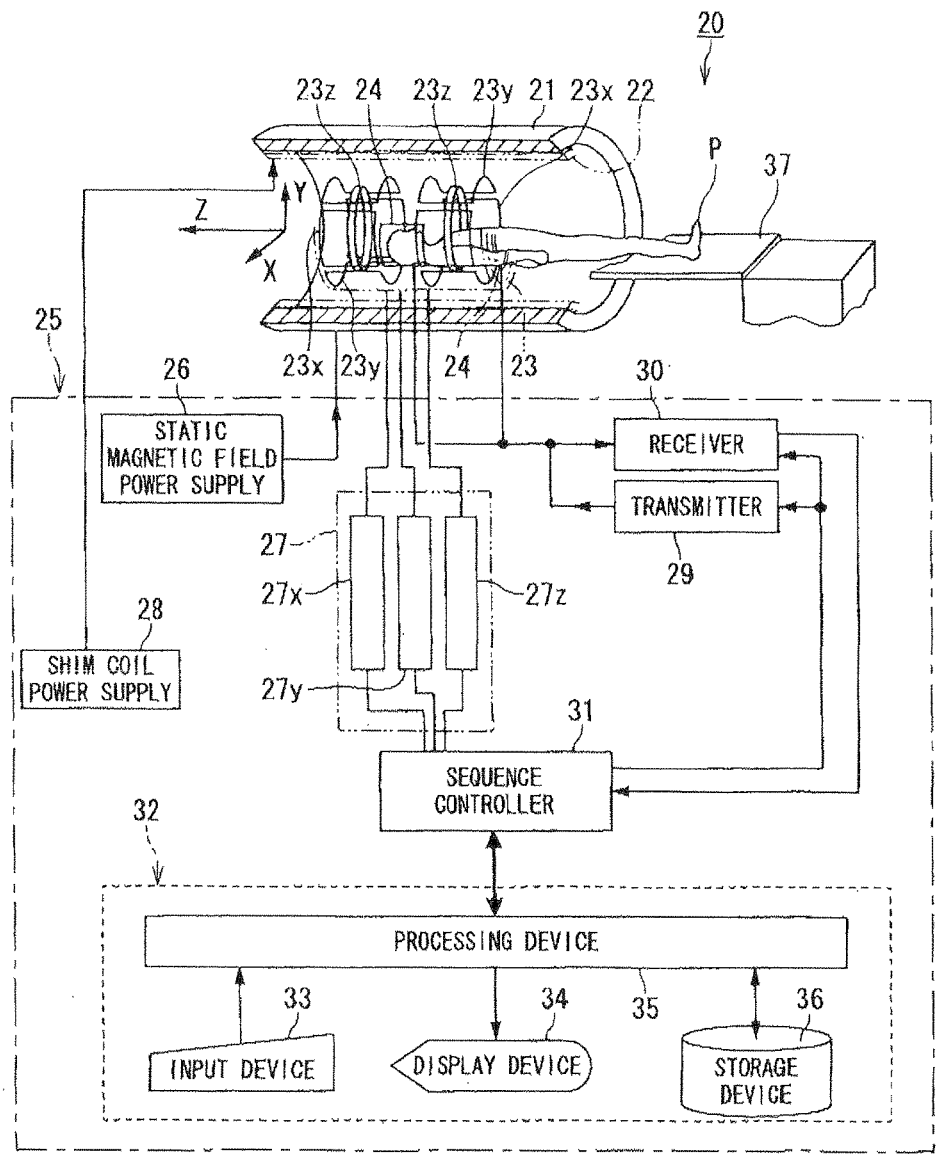
FIG. 1 is a configuration diagram showing an embodiment of a magnetic resonance imaging apparatus according to the present invention.

FIG. 1 is a configuration diagram showing an embodiment of a magnetic resonance imaging apparatus according to the present invention.

The magnetic resonance imaging apparatus 20 includes a static magnetic field magnet 21 which is cylindrical in shape and is configured to generate a static magnetic field, a shim coil 22 installed in the static magnetic field magnet 21, a gradient coil 23 and RF coils 24.

Also, the magnetic resonance imaging apparatus 20 includes a control system 25. The control system 25 has a static magnetic field power supply 26, a gradient power supply 27, a shim coil power supply 28, a transmitter 29, a receiver 30, a sequence controller 31 and a computer 32. The gradient power supply 27 of the control system 25 includes an X-axis gradient power supply 27x, Y-axis gradient power supply 27y and Z-axis gradient power supply 27z. Also, the computer 32 is equipped with an input device 33, a display device 34, a processing device 35 and a storage device 36.

The static magnetic field magnet 21, which is connected with the static magnetic field power supply 26, has a capability to form a static magnetic field in an imaging area using an electric current supplied from the static magnetic field power supply 26. The static magnetic field magnet 21 is often made of a superconducting coil and is connected with the static magnetic field power supply 26 during excitation to draw electric current, but generally becomes disconnected once excited. On the other hand, there are cases in which the static magnetic field magnet 21 is made of a permanent magnet without installation of the static magnetic field power supply 26.

The shim coil 22 which is cylindrical in shape is installed coaxially inside the static magnetic field magnet 21. The shim coil 22 is connected with the shim coil power supply 28, supplied with electric current from the shim coil power supply 28, and is configured to make the static magnetic field uniform.

The gradient coil 23 is made up of an X-axis gradient coil 23x, Y-axis gradient coil 23y and Z-axis gradient coil 23z and formed into a cylindrical shape inside the static magnetic field magnet 21. A bed 37 is installed in the gradient coil 23 and is used as an imaging area with a patient P placed thereon. The RF coils 24 include a whole body coil (WBC) incorporated in a gantry used to transmit and receive RF signals, and a local coil installed near the bed 37 or patient P used to receive RF signals.

The gradient coil 23 is connected with the gradient power supply 27. The X-axis gradient coil 23x, Y-axis gradient coil 23y and Z-axis gradient coil 23z of the gradient coil 23 are connected, respectively, with the X-axis gradient power supply 27x, Y-axis gradient power supply 27y and Z-axis gradient power supply 27z of the gradient power supply 27.

A gradient magnetic field Gx in an X-axis direction, gradient magnetic field Gy in a Y-axis direction and gradient magnetic field Gz in a Z-axis direction are formed, respectively, in the imaging area by electric currents supplied to the X-axis gradient coil 23x, Y-axis gradient coil 23y and Z-axis gradient coil 23z, respectively, from the X-axis gradient power supply 27x, Y-axis gradient power supply 27y and Z-axis gradient power supply 27z.

The RF coils 24 are connected to the transmitter 29 and/or receiver 30. Transmitting RF coils 24 have a capability to receive an RF signal from the transmitter 29 and transmit the RF signal to the patient P. Receiving RF coils 24 have a capability to receive an NMR signal generated when nuclear spins in the patient P is excited by the RF signal and supply the NMR signal to the receiver 30.

Figure 2:
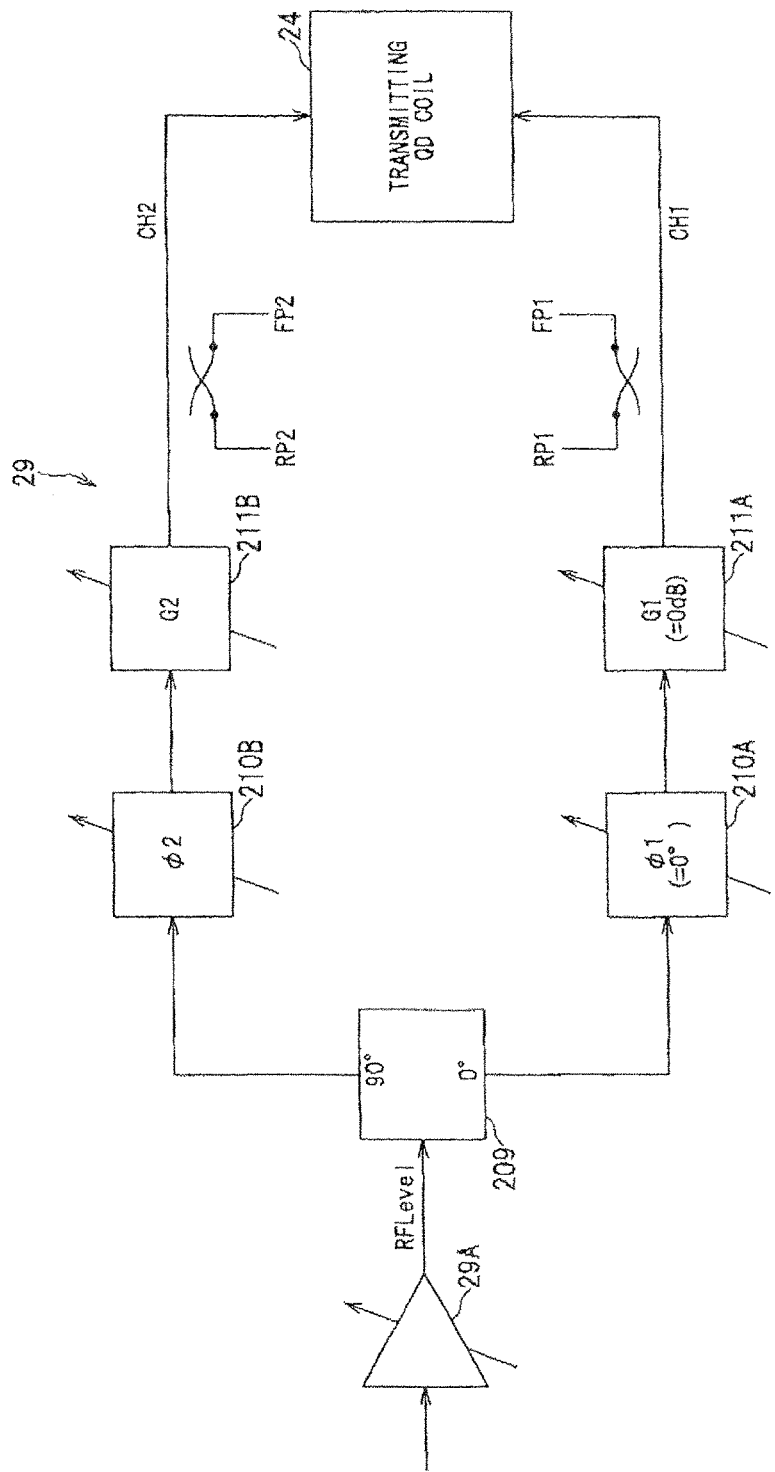
FIG. 2 is a diagram showing a detailed configuration example of a transmitting QD coil and transmitter.

FIG. 2 is a diagram showing a detailed configuration example of the transmitting RF coil 24 and transmitter 29 shown in FIG. 1.

The whole body coil 24A which is a transmitting RF coil 24 is configured as a QD coil. The QD coil is normally fed with transmit signals from two transmission channels ch1 and ch2 and generates magnetic fields spatially orthogonal to each other using the first transmission channel ch1 and second transmission channel ch2. Available types of QD coil include a cylindrical bird-cage type or a type made of independent two coils. With the bird-cage type QD coil, transmit signals through the channels ch1 and ch2 are fed, respectively, into two feeding points 90 degrees apart from each other on the cylinder. On the other hand, with the independent two coil type, transmit signals from the channels ch1 and ch2 are fed separately into two coils, respectively.

An RF transmit pulse outputted from an RF amplifier 29A is split by a 90-degree splitter 209 into two signals which are 90 degrees electrically out of phase with each other. These two signals are fed to the first and second transmission channels ch1 and ch2, respectively.

The transmitting QD coil applies two RF signals 90 degrees electrically out of phase with each other in directions spatially orthogonal to each other and thereby forms a perfectly uniform magnetic field on an XY plane of an imaging area under ideal conditions.

Actually, however, such ideal conditions do not exist. For example, the uniformity of the magnetic field is affected greatly by the positional relationship between the position of the transmitting QD coil and an imaging region (the head, abdomen, or wrists of the patient). That is, even if a transmitting QD coil (e.g., whole body coil) is used as a transmitting coil, the uniformity of the magnetic field is not necessarily ensured depending on the imaging region, and non-uniform state varies with the imaging region.

Also, the uniformity of the magnetic field is affected greatly by the type of coil used. For example, even if a transmitting QD coil is used, the uniformity of the magnetic field varies depending on what receiver coil is used: a torso coil or wrist coil.

Thus, as shown in FIG. 2, phase adjustment units 210A and 210B as well as gain adjustment units 211A and 211B are installed on the first and second transmission channels ch1 and ch2 as means for adjusting the uniformity of the magnetic field.

The phase adjustment units 210A and 210B and the gain adjustment units 211A and 211B allow adjustment of relative phase (phase balance) and relative gain (gain balance) between the channels. The phase adjustment units 210A and 210B as well as the gain adjustment units 211A and 211B may be installed separately on the respective channels as shown in FIG. 2 or installed only on one of the channels.

In the following description, it is assumed that the phase balance and gain balance between the channels are adjusted by varying phase $\Phi 2$ and gain G2 of the second transmission channel ch2, with phase $\Phi 1$ and gain G1 of the first transmission channel ch1 fixed at 0 degrees and 0 dB, respectively. Although variable ranges of the phase $\Phi 2$ and gain G2 are not limited particularly, the phase $\Phi 2$ may be set, for example, between $-90°$ and $90°$ and the gain G2 may be set, for example, between $-10$ dB and 10 dB.

Incidentally, only one of the phase $\Phi 2$ and gain G2 may be made adjustable.

The first and second transmission channels ch1 and ch2 are provided with a capability to measure power of a forward pulse of the RF transmit pulse to be outputted to the QD coil and a capability to measure power of reflected pulses coming from the QD coil.

Returning to FIG. 1, the sequence controller 31 of the control system 25 is connected with the gradient power supply 27, transmitter 29 and receiver 30. The sequence controller 31 has a capability to store control information such as sequence information needed to drive the gradient power supply 27, transmitter 29 and receiver 30, where the sequence information describes operational control information such as intensity, application duration and application timing of a pulsed current to be applied to the gradient power supply 27. The sequence controller 31 also has a capability to drive the gradient power supply 27, transmitter 29 and receiver 30 according to a stored predetermined sequence and thereby generate an X-axis gradient magnetic field Gx, Y-axis gradient magnetic field Gy, Z-axis gradient magnetic field Gz and RF signal.

The sequence controller 31 is configured to receive raw data and supply the raw data to the computer 32, where the raw data is complex data produced by the receiver 30 through detection and A/D (analog to digital) conversion of NMR signals.

The transmitter 29 supplies an RF signal to the RF coil 24 based on the control information received from the sequence controller 31. On the other hand, the receiver 30 detects the NMR signal received from the RF coil 24, performs necessary signal processing and A/D conversion, and thereby generates raw data which is digitized complex data, and supplies the generated raw data to the sequence controller 31.

The computer 32 can implement various functions by causing the processing device 35 to execute programs stored in the storage device 36 of the computer 32. However, specific circuits with various functions may be installed in the magnetic resonance imaging apparatus 20 without depending on programs.

Figure 3:
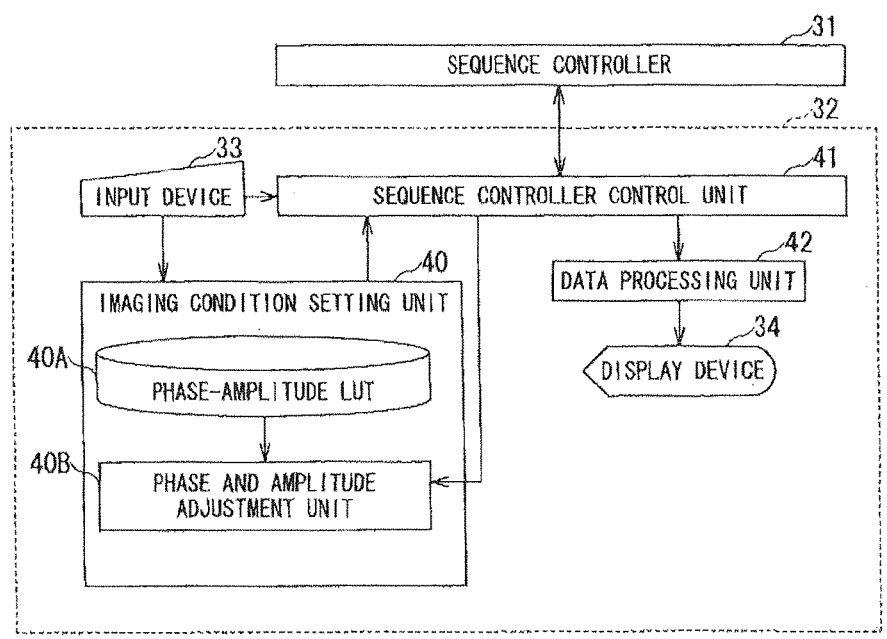
FIG. 3 is a functional block diagram of a computer.

FIG. 3 is a functional block diagram of the computer 32 shown in FIG. 1.

The computer 32 functions as an imaging condition setting unit 40, sequence controller control unit 41 and data processing unit 42 based on programs. The imaging condition setting unit 40 includes a phase-amplitude LUT (look-up table) 40A and a phase and amplitude adjustment unit 40B.

The imaging condition setting unit 40 has a capability to set imaging conditions including an imaging region, coil type and pulse sequence based on command information from the input device 33, and supply various parameters based on the set imaging conditions to the sequence controller control unit 41.

The phase-amplitude LUT 40A prestores appropriate phase and amplitude values of the RF transmit pulse, which can be used as reference. In the phase-amplitude LUT 40A, the phase and amplitude values are classified according to imaging conditions such as the imaging region or the type of transmitter coil or receiver coil used.

FIG. 4 is a diagram showing an example of the phase-amplitude LUT 40A. The phase-amplitude LUT 40A stores values of the phase $\Phi 2$ and gain G2 of the second transmission channel ch2 in terms of differences from the first transmission channel ch1. The values of the phase $\Phi 2$ and gain G2 in the phase-amplitude LUT 40A are associated with imaging regions such as a head, abdomen, or wrists of the patient, as well as coil types such as a phased array head coil, T/R (transmit/receive) head coil, torso coil, or wrist coil.

The phase-amplitude LUT 40A also stores gain correction values ($\Delta G$) according to body weight.

The phase $\Phi 2$ and gain G2 of the RF transmit pulse in the phase-amplitude LUT 40A can be determined by analysis of data collected by past scans or test scans, or through simulations. Alternatively, the phase $\Phi 2$ and gain G2 in the phase-amplitude LUT 40A may be determined by a method similar to the one used for a readjustment sequence described later.

Prior to an imaging scan, the phase and amplitude adjustment unit 40B adjusts the phase $\Phi 2$ and gain G2 of the RF transmit pulse to be appropriate values according to the imaging conditions by referring to the phase-amplitude LUT 40A. In addition, the phase and amplitude adjustment unit 40B has a capability to readjust the adjusted phase $\Phi 2$ and gain G2 of the RF transmit pulse further, based on image data and the like acquired from the sequence controller control unit 41, and set the finally-established phase $\Phi 2$ and gain G2 of the RF transmit pulse as imaging scan parameters on the sequence controller control unit 41.

The sequence controller control unit 41 outputs various parameters including a pulse sequence to the sequence controller 31 based on information from the input device 33 and imaging condition setting unit 40. Also, the sequence controller control unit 41 has a capability to receive raw data from the sequence controller 31 and supply the raw data as k-space data to the data processing unit 42.

The data processing unit 42 has a capability to apply an image reconstruction process including a Fourier transform (FT) to the k-space data, and thereby generate image data as well as a capability to apply necessary image processing to the image data and display the resulting image data on the display device 34.

(Operation)

Next, operation of the magnetic resonance imaging apparatus 20 will be described. In the example described below, it is assumed that the phase $\Phi 2$ and gain G2 of the second transmission channel ch2 are variable while the phase $\Phi 1$ and gain G1 of the first transmission channel ch1 are fixed.

Figure 5:
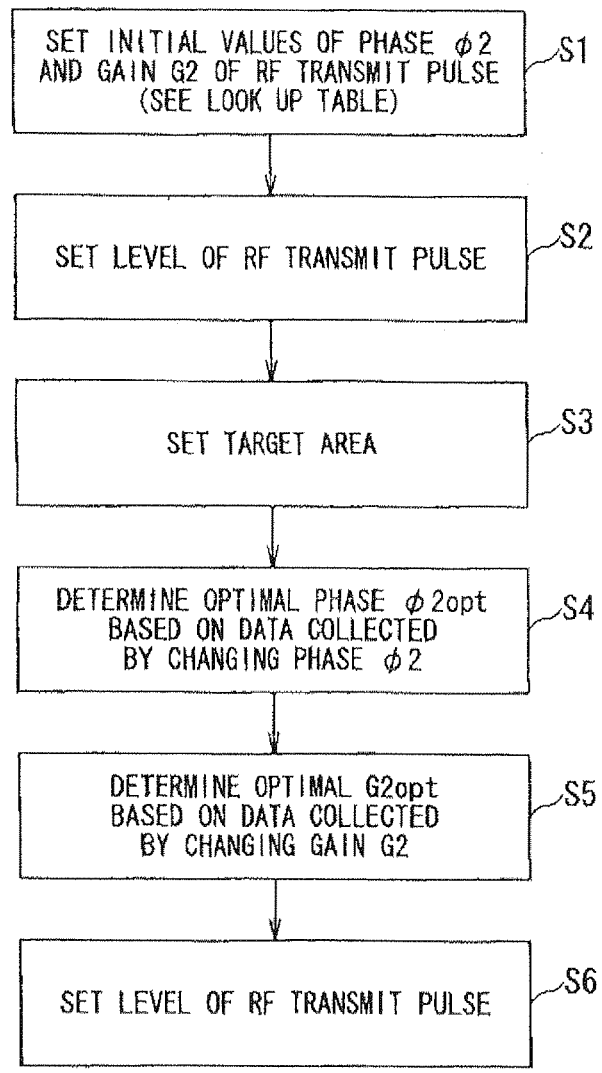
FIG. 5 is a flowchart showing exemplary procedures for adjusting phase and amplitude of an RF transmit pulse to improve B1 uniformity before imaging.

FIG. 5 is a flowchart showing exemplary procedures for adjusting the phase and amplitude of an RF transmit pulse to improve B1 uniformity before imaging on the magnetic resonance imaging apparatus 20 shown in FIG. 1.

To begin with, the patient P is placed on the bed 37 in advance and a static magnetic field is formed in an imaging area of the static magnetic field magnet 21 (superconducting magnet) excited by the static magnetic field power supply 26. Also, an electric current is supplied to the shim coil 22 from the shim coil power supply 28 and, consequently, the static magnetic field formed in the imaging area is made uniform.

In Step S1, the phase $\Phi 2$ and gain G2 of the RF transmit pulse transmitted from the second transmission channel ch2 are set to appropriate values according to the imaging conditions such as the imaging region of the patient and the type of coils used for imaging.

Specifically, the phase and amplitude adjustment unit 40B of the imaging condition setting unit 40 acquires the phase $\Phi 2$ and gain G2 of the RF transmit pulse which meet the imaging conditions by referring to the phase-amplitude LUT 40A and outputs the acquired phase $\Phi 2$ and gain G2 to the sequence controller control unit 41 so that the phase $\Phi 2$ and gain G2 will be set on the phase adjustment unit 210B and gain adjustment unit 211B of the transmitter 29, respectively.

As imaging conditions, the body weight and lying position of the patient may be used in addition to the imaging region of the patient and the type of coils used for imaging. For example, as shown in FIG. 3, when the body weight of the patient exceeds 80 kg, a gain correction value $\Delta G$ is added to the gain G2.

Also, when the lying position of the patient is lateral recumbent position (which results when the patient turns 90 degrees sideways from a supine position), the phase $\Phi 2$ and gain G2 of the RF transmit pulse acquired from the phase-amplitude LUT 40A is multiplied by −1. For example, if the phase $\Phi 2$ and gain G2 acquired from the phase-amplitude LUT 40A are 140 degrees and 3 dB, respectively, the phase $\Phi 2$ and gain G2 are corrected by being multiplied by −1 and, consequently, the values of the phase $\Phi 2$ and gain G2 read out of the phase-amplitude LUT 40A are replaced by −140 degrees and −3 dB, respectively.

Although the phase $\Phi 2$ and gain G2 of the RF transmit pulse can be set to appropriate values according to the imaging conditions by referring to the phase-amplitude LUT 40A, they can be set to more appropriate values by readjustment procedures in Step S2 and subsequent steps. In the processes of Step S2 and subsequent steps, the values of the phase $\Phi 2$ and gain G2 stored in the phase-amplitude LUT 40A are set as initial values in the phase adjustment unit 210B and gain adjustment unit 211B of the transmitter 29 and the phase $\Phi 2$ and gain G2 are readjusted based on image data acquired while changing the phase Φ2 and gain G2 from the initial values. The readjustment is performed as follows. First, in Step S2, an optimal output level RFlevel of the RF transmit pulse is determined. Specifically, signals are collected while changing an output power level of the RF transmit pulse using a known data collection method such as an SE (spin echo) method, and then the output level RFlevel which maximizes strength of the collected signals is determined.

Next, in Step S3, a target area is set to collect data for use to readjust the phase Φ2 and gain G2 of the RF transmit pulse. The target area for readjusting is set in correspondence to an imaging area for the imaging scan. An axial section is often selected as a target area, but a local area such as a sagittal section or coronal section may be selected.

Next, in Step S4, an optimal phase Φ2opt of the RF transmit pulse is determined based on the data collected while changing the phase Φ2 of the RF transmit pulse.

Specifically, signals are collected by changing the phase Φ2 of the RF transmit pulse without phase encoding. For example, if the initial value of the phase Φ2 of the RF transmit pulse stored in the phase-amplitude LUT 40A is 30°, the signals are collected by changing the phase Φ2 of the RF transmit pulse at intervals of 20° such as −90°, −70°, −50°, . . . , 90°. Then, the optimal phase Φ2opt which provides the highest B1 uniformity and consequently maximizes the strength of the signals collected from the target area is calculated. This is equivalent to determining such a phase Φ2 angle of the second channel ch2 that will cause the B1 transmitted from the first channel ch1 and the B1 transmitted from the second channel ch2 to intersect each other at right angles.

In so doing, a single-axis or two-axis slice selection SE method or a single-axis, two-axis or three-axis slice selection DSE (Double Spin Echo) method can be used as a data collection method.

Figure 6:
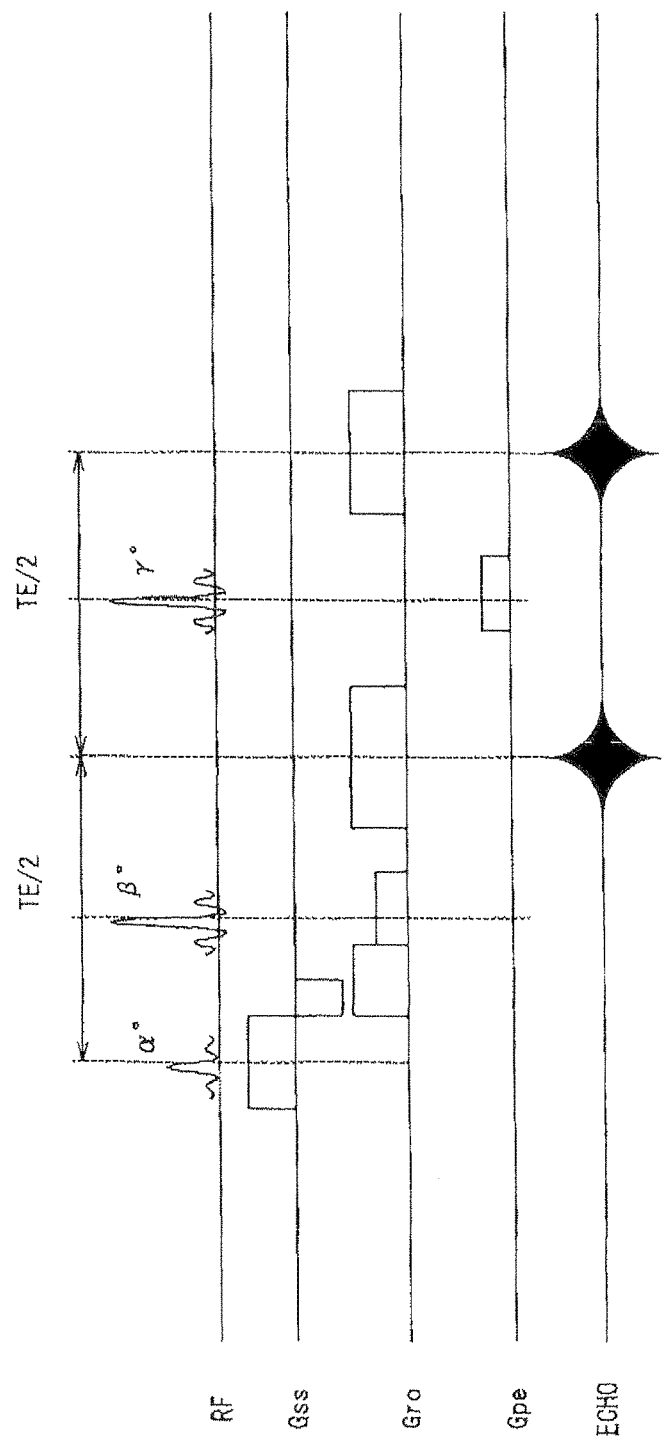
FIG. 6 is a diagram showing a DSE sequence for collecting data to determine an optimal phase of an RF transmit pulse.

In FIG. 6, reference character RF denotes the RF transmit pulse, Gss denotes a gradient magnetic field in a slice selection direction, Gro denotes a gradient magnetic field in a readout direction, Gpe denotes a gradient magnetic field in a phase encoding direction, and ECHO denotes echo signals collected.

In FIG. 6, reference character RE denotes the RF transmit pulse, Gss denotes a gradient magnetic field in a slice selection direction, Gro denotes a gradient magnetic field in a readout direction, Gpe denotes a gradient magnetic field in a phase encoding direction, and ECHO denotes echo signals collected.

As shown in FIG. 6, in the DSE sequence, an excitation pulse with a flip angle of α, the first refocusing pulse with a flip angle of β and the second refocusing pulse with a flip angle of γ are applied, accompanied by slice selections in the slice selection direction, readout direction and phase encoding direction, respectively. A gradient pulse for readout is applied after the application of the first refocusing pulse without application of a gradient pulse for phase encoding and, consequently, the first echo signal is collected TE/2 (TE stands for echo time) after the excitation pulse. Also, a gradient pulse for readout is applied after the application of the second refocusing pulse without application of a gradient pulse for phase encoding and, consequently, the second echo signal is collected TE/2 after the first echo signal.

If attenuation is ignored, strength Sse of the echo signal collected by the SE method is given by Equation (1), where α is the flip angle of the excitation pulse and β is the flip angle of the first refocusing pulse. Also, if attenuation is ignored, strength Sdse of the echo signal collected second by the DSE method is given by Equation (2), where α is the flip angle of the excitation pulse, β is the flip angle of the first refocusing pulse and γ is the flip angle of the second refocusing pulse as described above.

$$Sse=\sin(\alpha)\cdot\sin^2(\beta/2) \quad (1)$$

$$Sdse=\sin(\alpha)\cdot\sin^2(\beta/2)\cdot\sin^2(\gamma/2) \quad (2)$$

As can be seen from Equations (1) and (2), when the flip angle α is close to 90° or the refocusing angle β is close to 180°, which are both typical values, the strengths Sse and Sdse change gradually, and the changes in the signal strength are small compared to variations in a B1 magnetic field. On the other hand, if the flip angle α and the refocusing angles β and γ in the SE or DSE method are set smaller than typical flip angles, slopes of changes in the strengths Sse and Sdse are increased. Consequently, a degree of the B1 non-uniformity can be reflected in the signals with high sensitivity. In other words, if the flip angles are set to be small, signals which are sensitive to the changes in the B1 magnetic field can be collected, making it possible to more accurately determine the phase Φ2 for increasing the B1 uniformity.

For example, in the case of the SE method, preferably the flip angles α and β of the excitation pulse and first refocusing pulse are set to 30° and −60°, respectively, rather than typical angles of 90° and −180°. In the case of the DSE method, preferably the flip angle α of the excitation pulse and the flip angles β and γ of the refocusing pulses are set to 30°, −60° and −60° rather than typical angles of 90°, −180° and −180°.

Based on the echo signals collected by the SE method or DSE method, an index which represents non-uniformity of the image is calculated for each value of the phase Φ2. The index which represents the non-uniformity of the image may be an area where intensity of the image along one axis deviates from an average of the intensity, or a variance around the average. The area or the variance may be obtained within a range in which deviation from an average exceeds a threshold (e.g., −20% and below and/or 20% and above). Specifically, an index S which represents the non-uniformity of the image in the readout direction can be calculated for each value of the phase Φ2 by computing 1D FFT (one-dimensional fast Fourier transformation) of the echo signals collected at a small flip angles α and β of the excitation pulse and refocusing pulse using the SE method or the second echo signal collected at a small flip angles α, β and γ of the excitation pulse and refocusing pulses using the DSE method.

Figure 7:
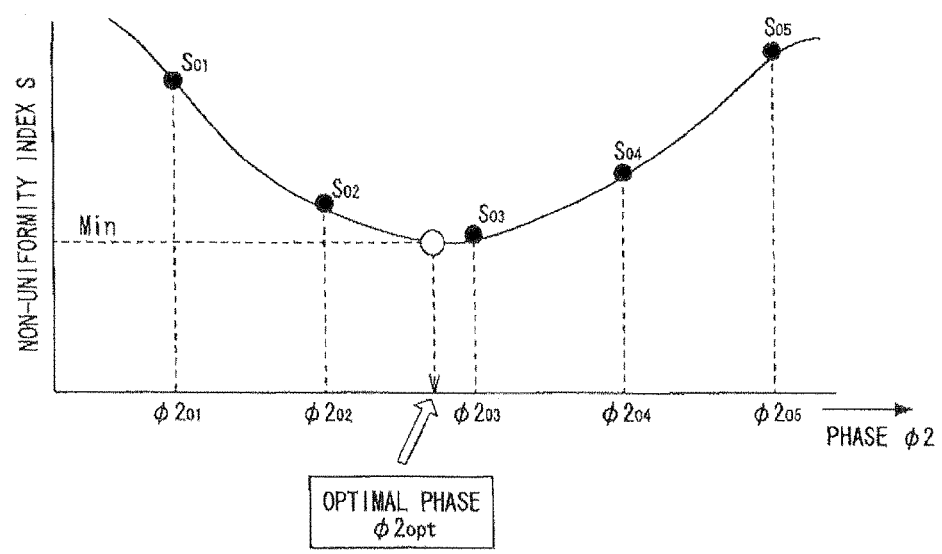
FIG. 7 is a diagram illustrating a method for determining an optimal phase $\Phi 2opt$ from a curve which represents changes in non-uniformity of image values vs. changes in phase $\Phi 2$ of an RF transmit pulse.

FIG. 7 is a diagram showing a curve of changes in the non-uniformity index S of image values with respect to the phase Φ2 of the RF transmit pulse.

First, an average of the intensity of the image in the readout direction is calculated, then, the area or the variance is calculated as index values S01, S02, S03, and so forth. Then, a known approximation method such as polynomial fitting is applied to the index values S01, S02, S03, and so forth to obtain a non-uniformity curve such as represented by a solid line in FIG. 7. This makes it possible to determine the optimal phase Φ2opt which minimizes the non-uniformity curve.

In addition to the example described above, various methods are available for use to find the optimal phase Φ2opt. For example, with the DSE method, echo signals may be collected by setting only the flip angle γ of the second refocusing pulse to a value smaller than usual, with the flip angle α of the excitation pulse and flip angle β of the first refocusing pulse set to typical values of 90° and 180°, respectively. In this case, the phase Φ2 which minimizes the quotient obtained by dividing the non-uniformity index value of the image of the second echo signal by the non-uniformity index value of the image of the first echo signal may be used as the optimal phase Φ2opt. This approach provides the advantage of being robust to the effects of body movements.

The optimal phase Φ2opt may also be determined based on a phase Φ2-dependent non-uniformity index which involves three or more echo signals, by collecting the echo signals using a sequence for collecting three or more echo signals. For example, a 2D (two-dimensional) image can be obtained by collecting eight or so echo signals by single-shot or multi-shot (two-shot or so) imaging while performing phase encoding using the FSE (fast spin echo) method and then by applying a 2D FFT to the collected echo signals. Then, a non-uniformity index curve with respect to the phase Φ2 can be created using pixel values of the 2D image data.

Another example involves collecting 1D or 2D B1 map data in different phases Φ2 by a known technique which uses a gradient echo method and creating a non-uniformity index curve with respect to the phase Φ2 based on a representative value of the B1 map data for each phase Φ2. In this case, sensitivity to non-uniformity can be improved if intensity changes of the map data is enhanced by squaring or cubing the B1 map data before creating the non-uniformity index curve. For example, to obtain B1 map data only in the readout direction using a sequence without phase encoding, a square value or cubic value of B1 map data can be calculated for each value of the phase Φ2 only in the readout direction and a non-uniformity index curve with respect to the phase Φ2 can be created.

The optimal phase Φ2opt of the RF transmit pulse may be determined by taking forward power FP of the refocusing pulse into consideration in addition to the B1 non-uniformity index S.

Figure 8:
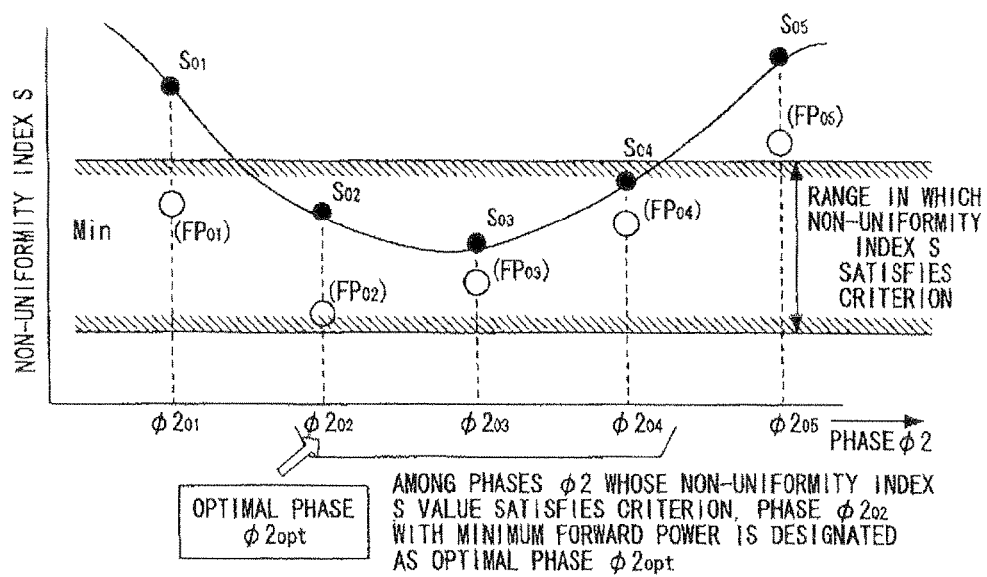
FIG. 8 is a diagram illustrating a method for determining the optimal phase $\Phi 2opt$ from uniformity of image values and forward power of a refocusing pulse.

Specifically, as shown in FIG. 8, among the phases Φ2 in which the non-uniformity index S falls within a predetermined reference range (e.g., within ±10% of a minimum value of the non-uniformity index S), a phase Φ2 which minimizes a total value FP of forward powers FP1 and FP2 of the refocusing pulse transmitted from the two transmission channels ch1 and ch2 may be designated as the optimal phase Φ2opt. The forward powers FP1 and FP2 of the refocusing pulse can be measured using a system shown in FIG. 2 while the non-uniformity index S is measured, by changing the phase Φ2. With this method, the phase Φ2 which provides good B1 uniformity and reduces the forward power of the refocusing pulse is determined as the optimal phase Φ2opt.

Incidentally, if data collection time is likely to be long due to increase of the number of conditions, the data collection time can be reduced by limiting the variable range of the phase Φ2, for example, to between 0° and 90°.

Figures 9A, 9B:
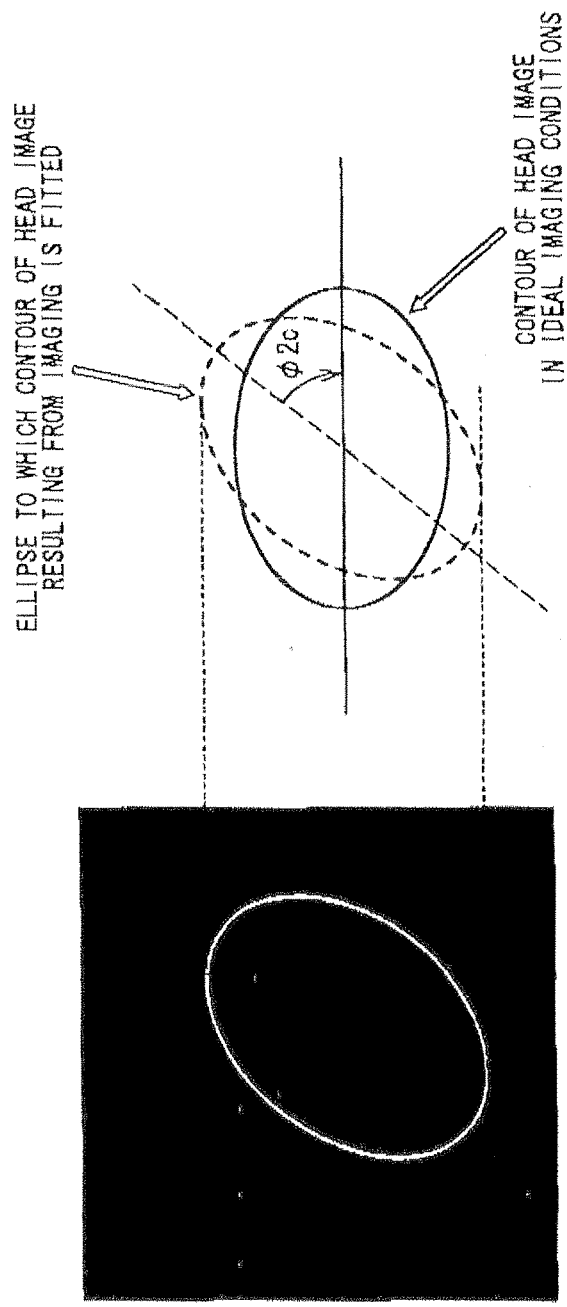
FIGS. 9A and 9B are diagrams illustrating a method for determining the optimal phase $\Phi 2opt$ of an RF transmit pulse using symmetry of B1 map data in the head.

So far, description has been given of a technique for determining the optimal phase Φ2opt from the B1 non-uniformity index S or B1 map data acquired by changing the phase Φ2, however, the optimal phase Φ2opt can also be found directly from a single set of B1 map data obtained with a phase Φ2int set as an initial value without changing the phase Φ2. FIGS. 9A and 9B are diagrams illustrating a concept of this technique.

FIG. 9A is a diagram showing B1 map data of a head of the patient superimposed with a white line. The white line is obtained by linking the same values in the B1 map data and fitting a resulting contour to an elliptical model.

Generally, B1 map data of the head has a contour of a relatively stable shape. When the phases Φ2 of the first and second transmission channels ch1 and ch2 are in ideal conditions, an axial section of the head of the patient lying in a supine position is longer in a horizontal direction than in a vertical direction. Therefore, when the phase Φ2 is in ideal conditions, a major axis of an ellipse to which the contour of the head is fitted, as shown by a solid line in FIG. 9B, is oriented in the horizontal direction.

On the other hand, if the phase Φ2 deviates from the ideal conditions, the major axis of the ellipse to which the head contour is fitted, as shown by a broken line in FIG. 9B, has an angle Φ2c with respect to the horizontal direction rather than being horizontal. The angle in degree corresponds to a deviation from an ideal value of phase Φ2 in degree. Therefore, by correcting the initial value Φ2int (deg) of the phase Φ2 with which sloped B1 map data by the angle equal to the slope Φ2c, the ideal value of the phase Φ2, i.e., the optimal phase Φ2opt (deg), can be obtained.

Thus, with the present technique, the contour of the B1 map data obtained in a phase Φ2int which is set as an initial value is fitted to an ellipse, and the deviation of the major axis of the resulting ellipse from the horizontal direction is used as a correction value Φ2c of the phase Φ2. Then, the initial phase Φ2int (deg) is corrected by the correction value Φ2c (using addition or subtraction) to obtain the optimal phase Φ2opt. Although the present technique has limited applicability, being applicable only to regions, such as the head, which have an easily identifiable shape, the present technique can reduce the time required for correction because the optimal phase Φ2opt can be found directly from a single set of B1 map data.

Next, in Step S5, optimal gain G2opt of the RF transmit pulse is determined based on data collected while changing the gain G2 of the RF transmit pulse. In Step S5, the phase φ2 of the RF transmit pulse remains fixed at the determined optimal phase φ2opt.

Specifically, signals are collected by changing the gain G2 of the RF transmit pulse. For example, if 2 dB is stored in the phase-amplitude LUT 40A as an initial value of the gain G2 of the RF transmit pulse, signals are collected by changing the gain G2 of the RF transmit pulse at intervals of 2 dB such as −8 dB, −6 dB, −4 dB, . . . , 8 dB. Consequently, the optimal gain G2opt which provides high B1 uniformity and maximizes the strength of the signals collected from the target area is calculated. Incidentally, to compare multiple signals at different gains G2, the output level RFlevel of the RF transmit pulse is adjusted so as to make total power of the transmit pulse outputted from the two channels ch1 and ch2 constant. For example, if the output level RFlevel in initial state is 50 dB, the RF transmit pulse is outputted from the first channel ch1 at 50 dB. On the other hand, the RF transmit pulse is outputted from the second channel ch2 at 52 dB, which is equal to the output level RFlevel of 50 dB plus the initial value of the gain G2 of 2 dB. That is, the total power of the RF transmit pulse is 102 dB in decibel terms. On the other hand, if the gain G2 of the second channel ch2 is set, for example, to +6 dB, the output level RFlevel is set to 48 dB. In this case, the RF transmit pulses are outputted at 54 dB from the second channel ch2 and at 48 dB from the first channel ch1, for a total power of 102 dB all the same, thereby making the total power constant.

The optimal gain G2opt can also be determined from a B1 non-uniformity index curve or B1 map data plotted or obtained at different gains G2, as in the case of the optimal phase Φ2opt. Also, in determining the optimal gain G2opt, the gain G2 which minimizes the forward power of the refocusing pulse can be selected out of the gains G2 at which non-uniformity falls within a predetermined reference range and designated as the optimal gain G2opt.

Incidentally, if data collection time is likely to be long due to increase of the number of conditions, the data collection time can be reduced by limiting the variable range of the gain G2, for example, to between 0 dB and 6 dB.

Next, in Step S6, the output level RFlevel of the RF transmit pulse is readjusted as required. That is, since the phase Φ2 and gain G2 of the RF transmit pulse have been readjusted to be the optimal phase Φ2opt and gain G2opt, the conditions for determining the optimal output level RFlevel of the RF transmit pulse have been changed as well. Thus, desirably, the output level RFlevel of the RF transmit pulse is readjusted under condition of the optimal phase Φ2opt and gain G2opt of the RF transmit pulse.

The readjusting of the output level RFlevel can be done in the same manner as in Step S2, but another method may be used.

For example, echo signals can be collected from the target area while changing the output level RFlevel using the SE method or DSE method and the output level RFlevel which maximizes the strength of the collected echo signals can be used as a readjusted value. The target area is set in correspondence to the imaging area for the imaging scan.

Alternatively, B1 map data can be collected from the target area while changing the output level RFlevel using the SE method or DSE method and the optimal value of the output level. RFlevel can be found based on the B1 map data obtained at each output level RFlevel. That is, a B1 non-uniformity index curve can be created by plotting at each output level RFlevel based on the variance and average value of the B1 map data and the output level RFlevel which minimizes the B1 non-uniformity index can be used as a readjusted value. Alternatively, the output level RFlevel corresponding to optimal B1 map data may be used as a readjusted value.

Still another example involves storing amounts of correction to a default value of the output level RFlevel in the phase-amplitude LUT 40A by classifying the amounts of correction according to imaging conditions such as the imaging region and the type of transmitter coil as well as to the phase Φ2 and gain G2 of the RF transmit pulse. Then, the phase and amplitude adjustment unit 40B can acquire the appropriate amount of correction according to imaging conditions, phase Φ2 and gain G2 from the phase-amplitude LUT 40A and readjust the output level RFlevel according to the acquired amount of correction.

In this way, the phase and amplitude adjustment unit 40B can find the optimal phase Φ2opt, gain G2opt and output level RFlevel of the RF transmit pulse according to the imaging conditions. Incidentally, to reduce the data collection time, any of the steps other than Step S1 may be omitted. Also, the optimal gain G2opt may be determined before the optimal phase Φ2opt is determined with the gain G2 fixed. However, the phase Φ2 has a more dominant impact on the B1 uniformity than does the gain G2. Therefore, it is more desirable to determine the optimal phase Φ2opt before determining the optimal gain G2opt.

Furthermore, to reduce the data collection time, echo signals can be collected by changing both phase Φ2 and gain G2 and then both optimal phase Φ2opt and optimal gain G2opt can be found at the same time. That is, the B1 non-uniformity index or B1 map data may be acquired by changing both phase Φ2 and gain G2. Also, the forward power of the refocusing pulse may be acquired by changing both phase Φ2 and gain G2. Also, the forward power of the refocusing pulse can be obtained by changing both the phase Φ2 and the gain G2. Then, both optimal phase Φ2opt and optimal gain G2opt can be found simultaneously to further reduce the B1 non-uniformity and the forward power of the refocusing pulse.

With the technique described above, it is assumed that the procedures for readjustment of the phase Φ2 and gain G2 in Steps S2 to S6 (especially Steps S3 to S5) are carried out. Therefore, the initial values of the phase Φ2 and gain G2 stored in the phase-amplitude LUT 40A do not need to be very accurate.

Conversely, the procedures for readjustment of the phase Φ2 and gain G2 in Steps S3 to S5 may be carried out in advance for each imaging region and coil type, and the optimal phase Φ2opt and optimal gain G2opt thus obtained may be stored in advance in the phase-amplitude LUT 40A by being associated with the imaging region and coil type. In this case, since the optimal phase Φ2opt and optimal gain G2opt with high accuracy are obtained by referring to the phase-amplitude LUT 40A in Step S1, the readjustment procedures in Steps S2 to S6 (especially Steps S3 to S5) may be omitted.

In the example described above, RF transmit pulses are transmitted simultaneously via two transmission channels, i.e., the first and second transmission channels ch1 and ch2, by changing the phase Φ2 or gain G2 and then the phase Φ2 and gain G2 of the second channel ch2 are readjusted based on multiple items of data obtained for different values of the phase 2 and gain G2. Even for a case in which a fitting curve of an ellipse is found from the B1 map data of the head, and the optimal phase Φ2opt is determined based on the angle of the major axis of the ellipse and the angle of the major axis of an ideal ellipse, transmission is performed simultaneously via the first and second transmission channels ch1 and ch2.

In contrast, with the method described below, the optimal phase Φ2opt and optimal gain G2opt are determined from two sets of B1 map data, including B1 map data obtained by means of transmission via the first transmission channel ch1 alone and B1 map data obtained by means of transmission via the second transmission channel ch2 alone. This method will be referred to hereinafter as an independent-channel transmission method. The independent-channel transmission method can find the optimal phase Φ2opt and optimal gain G2opt directly from the two sets of B1 map data without varying the phase Φ2 and gain G2 in multiple steps.

Figure 10:
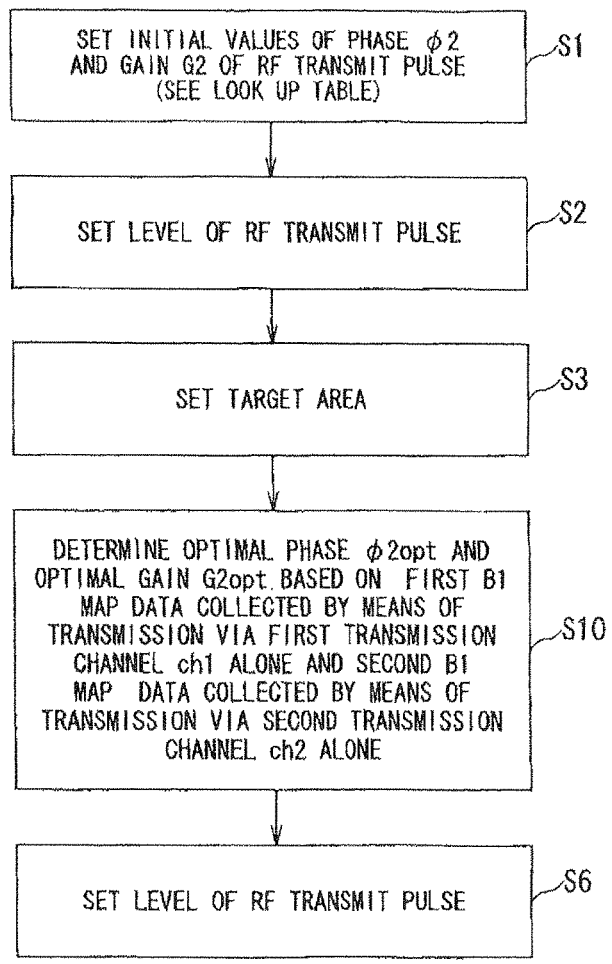
FIG. 10 is a flowchart showing exemplary procedures for adjusting the phase $\Phi 2$ and gain G2 based on two sets of B1 map data collected by means of independent transmission via two channels ch1 and ch2.

FIG. 10 is a flowchart showing exemplary procedures for finding the optimal phase Φ2opt and optimal gain G2opt using the independent-channel transmission method. In FIG. 10, steps equivalent to those in FIG. 5 are denoted by the same step numbers as the corresponding steps in FIG. 5, and description thereof will be omitted.

With the independent-channel transmission method, in Step S10, the optimal phase Φ2opt and optimal gain G2opt of the second transmission channel ch2 are determined based on first B1 map data collected by means of transmission via the first transmission channel ch1 alone and second B1 map data collected by means of transmission via the second transmission channel ch2 alone.

Figure 11A:
FIGS. 11A and 11B are diagrams showing an example of two sets of B1 map data collected by using the two channels ch1 and ch2 separately.
Figure 11B:
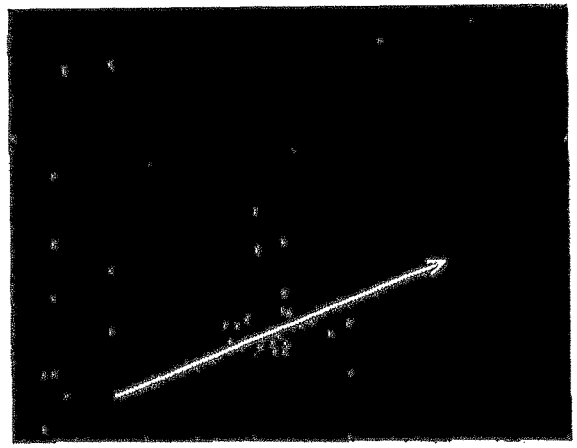

FIG. 11A shows an image which results when the first B1 map data acquired using a thin phantom is displayed with plural contours, where the first B1 map data has been collected by means of transmission via the first transmission channel ch1 alone with the second transmission channel ch2 turned off. On the other hand, FIG. 11B shows an image which results when the second B1 map data acquired using a thin phantom is displayed with plural contours, where the second B1 map data has been collected by means of transmission via the second transmission channel ch2 alone with the first transmission channel ch1 turned off.

Out of arbitrary lines passing through a center of the image, a line which maximizes uniformity of amplitude distribution will be referred to hereinafter as a maximum uniformity line. White arrows shown in FIGS. 11A and 11B indicate the maximum uniformity lines of first and second B1 map data, respectively.

When the phantom is spherical, ideally the maximum uniformity line of the first B1 map data collected by means of transmission via the first transmission channel ch1 alone corresponds in orientation to a magnetic field formed in the horizontal direction by the first transmission channel ch1, and thus has a horizontal orientation, i.e., an angle of 0°. On the other hand, the maximum uniformity line of the second B1 map data collected by means of transmission via the second transmission channel ch2 alone corresponds in orientation to a magnetic field formed in the vertical direction by the second transmission channel ch2, and thus has a vertical orientation, i.e., an angle of 90°.

Although shape of the B1 map data varies depending on shape of the phantom, the above-described feature regarding the orientation of the maximum uniformity line is generally maintained.

In FIG. 11A, the angle of the maximum uniformity line is approximately 0°, which is close to an ideal state. On the other hand, in FIG. 11B, the angle of the maximum uniformity line is approximately 30°, which deviates approximately 60° from the ideal angle of 90°. An amount of correction for use to correct the phase $\Phi 2$ of the second transmission channel ch2 can be determined in such a way that the angle of the maximum uniformity line for the second B1 map data will be 90°. Specifically, a difference between an angle (30° in this case) formed by the respective maximum uniformity lines of the first and second B1 map data and an angle of 90° formed by the two maximum uniformity lines in ideal conditions can be used as an amount of correction for use to determine the optimal phase $\Phi 2opt$ of the second transmission channel ch2. In the example of FIGS. 11A and 11B, the amount of correction to the phase $\Phi 2$ of the second transmission channel ch2 is 60°.

Figure 12A:
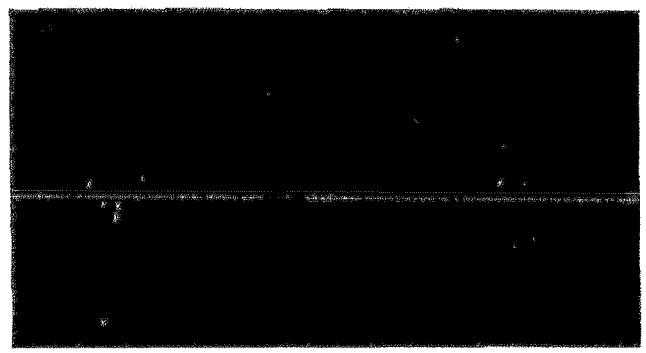
FIGS. 12A and 12B are diagrams each showing an example which compares B1 map data collected before and after correction of the phase $\Phi 2$, where the phase $\Phi 2$ is corrected by being shifted 60° from its initial value.
Figure 12B:
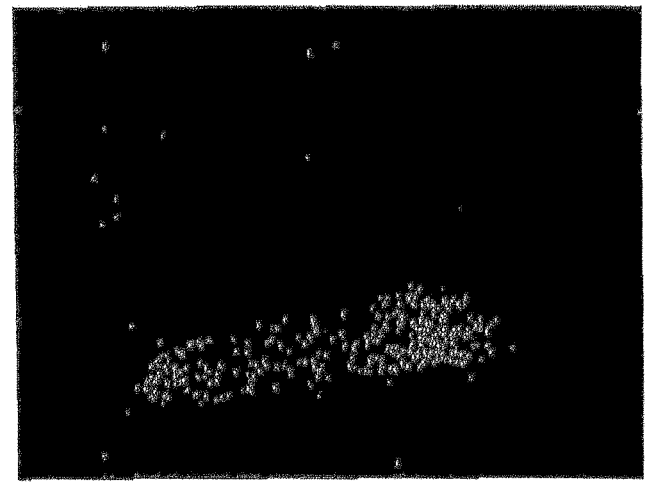

FIG. 12A shows an image resulting from a B1 map data collected by means of simultaneous transmission via the first and second transmission channels ch1 and ch2 with the phase $\Phi 2$ of the second transmission channel ch2 kept at the initial value without making the correction described above. On the other hand, FIG. 12B shows an image resulting from a B1 map data collected by means of simultaneous transmission via the first and second transmission channels ch1 and ch2 after correcting (readjusting) the phase $\Phi 2$ of the second transmission channel ch2 by 60° from the initial value. It can be seen from FIG. 12B that the correction to (readjustment of) the phase $\Phi 2$ of the second transmission channel ch2 has resulted in improvement of the B1 map data.

The maximum uniformity line can be extracted, for example, as follows. First, a center of the imaging area is found using arbitrary image data collected in advance, such as sensitivity map data of receiver coils or positioning (locator) image, data. Next, in the B1 map data, straight lines are drawn radially from the center of the imaging area at desired intervals such as 5-degree intervals and a representative value (e.g., average value) of B1 values on each straight line is calculated. The average value of B1 values can serve as an index which represents the uniformity of B1 values on the straight line. Thus, the straight line which maximizes the representative value (e.g., average value) of B1 values can be extracted as the maximum uniformity line.

On the other hand, the amount of correction for use to readjust the gain G2 of the second transmission channel ch2 can be determined based on the first and second B1 map data collected by means of separate transmission via the first and second transmission channels ch1 and ch2, as with the amount of correction to the phase $\Phi 2$.

Specifically, after finding contribution of the RF transmit pulse transmitted via the first transmission channel ch1 to the B1 uniformity and contribution of the RF transmit pulse transmitted via the second transmission channel ch2 to the B1 uniformity, the amount of correction to the gain G2 is determined such that the RF transmit pulse transmitted via the channel which makes greater contribution will have a larger amplitude.

For example, it can be seen from FIG. 11A that strength of the B1 formed near a center of imaging by the RF transmit pulse transmitted via the first transmission channel ch1 is low. On the other hand, it can be seen from FIG. 11B that high-strength B1 is formed near the center of imaging by the RF transmit pulse transmitted via the second transmission channel ch2. Thus, it is desirable, in terms of increasing the uniformity, to relatively increase the gain G2 of the second transmission channel ch2 than to increase the gain G1 of the first transmission channel ch1.

The contribution to the B1 uniformity can be found using any of various indices. For example, by drawing straight lines radially from the center of the imaging area at desired intervals such as 5-degree intervals in the B1 map data, a representative value such as the average value or total value of B1 values on each straight line can be calculated. Then, a sum of the representative values of B1 values on the straight lines can be used as an index of contribution to the B1 uniformity.

In this case, the amount of correction $\Delta gain2$ to the initial value of the gain G2 can be calculated, for example, based on a ratio between contributions of the two transmission channels ch1 and ch2 to the B1 uniformity as shown in Equation (3).

$$\Delta gain2\ (dB) = 20\ \log_{10}(SumB1ch2/SumB1ch1) \quad (3)$$

where SumB1ch1 is the sum total (antilogarithm) of B1 representative values on the straight lines on the B1 map data for the first transmission channel ch1 and SumB1ch2 is the sum total (antilogarithm) of B1 representative values on the straight lines on the B1 map data for the second transmission channel ch2.

Figure 13A:
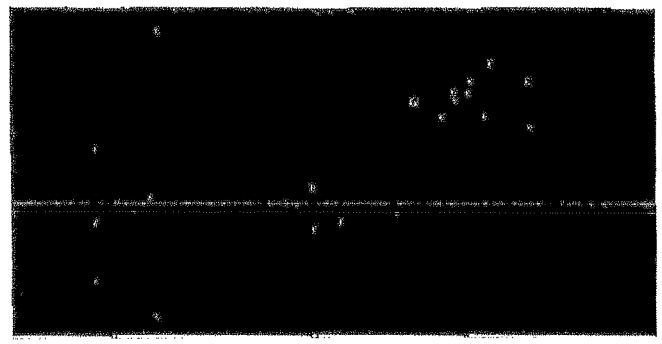
FIGS. 13A and 13B are diagrams each showing an example which compares two sets of B1 map data collected by correcting the gain G2 by different amounts of correction $\Delta gain2$, where the amounts of correction $\Delta gain2$ used are −5 dB and +5 dB of an initial value of the gain G2.
Figure 13B:
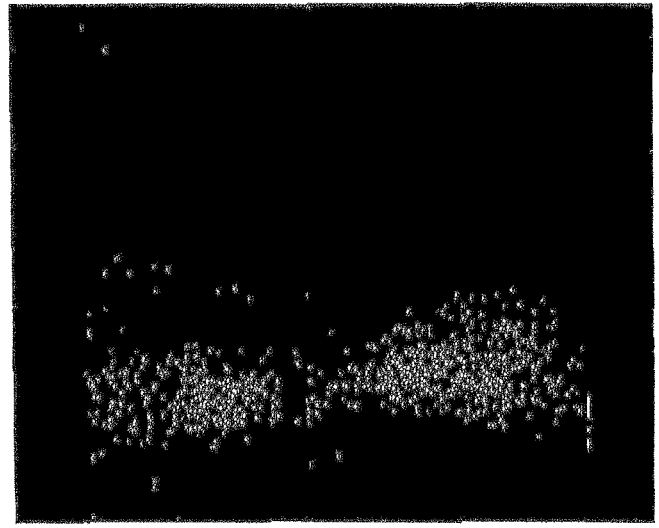

FIG. 13A shows an image resulting from B1 map data collected by means of simultaneous transmission via the first and second transmission channels ch1 and ch2 with the amount of correction $\Delta gain2$ to the initial value of the gain G2 of the second transmission channel ch2 set at −5 dB. On the other hand, FIG. 13B shows an image resulting from B1 map data collected by means of simultaneous transmission via the first and second transmission channels ch1 and ch2 with the amount of correction $\Delta gain2$ to the initial value of the gain G2 of the second transmission channel ch2 set at +5 dB. In both FIGS. 13A and 13B, the amount of correction $\Delta gain2$ to the phase $\Phi 2$ of the second transmission channel ch2 is fixed at 60°.

It can be seen from FIG. 13A that since the first transmission channel ch1 whose contribution to the B1 uniformity is small has its gain G1 set relatively high, the B1 strength in the center of imaging is low, reducing the B1 uniformity. On the other hand, it can be seen from FIG. 13B that since the second transmission channel ch2 whose contribution to the B1 uniformity is large has its gain G2 set relatively high, the B1 strength in the center of imaging is high, improving the B1 uniformity.

Although in the example described above, both phase Φ2 and gain G2 of the second channel ch2 are readjusted (corrected) based on two sets of B1 map data (i.e., the first and second B1 map data), the readjustment of one of the phase Φ2 and gain G2 may be omitted.

Also, the user may be allowed to manually readjust one or both of the phase Φ2 and gain G2 by operating the input device 33 with reference to images displayed on the display device 34 based on the two sets of B1 map data.

Once the optimal phase Φ2opt and optimal gain G2opt are determined in the manner described above, the imaging condition setting unit 40 supplies various parameters and the like related to the optimal phase Φ2opt, optimal gain G2opt and pulse sequence to the sequence controller control unit 41. This makes it possible to perform imaging scans. The imaging scans are performed as follows.

As a scan start command is given to the sequence controller control unit 41 from the input device 33, the sequence controller control unit 41 supplies various imaging parameters acquired from the imaging condition setting unit 40 to the sequence controller 31. Based on the various imaging parameters received from the sequence controller control unit 41, the sequence controller 31 drives the gradient power supply 27, transmitter 29 and receiver 30, causing a gradient magnetic field to be formed in the imaging area in which the patient P is placed, and an RF signal to be generated from the RF coil 24.

Consequently, an NMR signal generated by nuclear magnetic resonance in the patient F is received by the RF coil 24 and supplied to the receiver 30. Upon receiving the NMR signal from the RF coil 24, the receiver 30 performs required signal processing, and then generates raw data by A/D converting the NMR signal into digital data. The receiver 30 supplies the generated raw data to the sequence controller 31. The sequence controller 31 supplies the raw data to the sequence controller control unit 41, which then supplies the raw data as k-space data to the data processing unit 42.

Next, the data processing unit 42 applies an image reconstruction process to the k-space data, thereby generating image data, applies necessary image processing to the image data, and displays the resulting image data on the display device 34. This allows the user to check a diagnostic image.

That is, the magnetic resonance imaging apparatus 20 described above is configured to be able to adjust the phase and amplitude of the RF transmit pulse appropriately according to imaging conditions such as the imaging region and/or RF coil type as well as readjust the phase and amplitude of the RF transmit pulse as required based on collected data so as to make transmitted B1 more uniform. Thus, the magnetic resonance imaging apparatus 20 can acquire more uniform transmitted B1 according to imaging conditions such as the imaging region and/or RF coil type.

While certain embodiments have been described, these embodiments have been presented by way of example only, and are not intended to limit the scope of the invention. Indeed, the novel apparatuses and units described herein may be embodied in a variety of other forms; furthermore, various omissions, substitutions and changes in the form of the apparatuses and units described herein may be made without departing from the spirit of the invention. The accompanying claims and their equivalents are intended to cover such forms or modifications as would fall within the scope and spirit of the invention.

What is claimed is:

1. A magnetic resonance imaging apparatus comprising:
radio frequency (RF) transmitter circuitry having an RF output split into phase quadrature first and second RF output channels, a controllable RF phase adjustment circuit being included in at least one of said channels and a controllable RF gain adjustment circuit being included in at least one of said channels thereby providing controllable adjustments of relative phase and relative amplitude gain between the channels;
a transmitting QD coil including a first RF input port connected to said first RF output channel and a second RF input port connected to said second RF output channel; and
processing circuitry connected to control said controllable RF phase adjustment circuit and said controllable RF gain adjustment circuit, said processing circuitry being configured to adjust the relative phase and amplitude of an RF transmit pulse between the first and second RF output channels according to selected imaging conditions based on previously collected MRI signals for those conditions so as to enhance uniformity of RF B1 fields within the QD coil during imaging scans for the selected imaging conditions;
the magnetic resonance imaging apparatus further comprises a storage device configured to store (A) selectable imaging conditions and (B) at least one of phase and amplitude parameters of the RF transmit pulse associated with the imaging conditions; and
the processing circuitry is configured to acquire at least one of the phase and amplitude parameters of the RF transmit pulse associated with selected imaging conditions from the storage device as an initial value, and to adjust the at least one of the phase and amplitude parameters using the acquired initial value.

2. The magnetic resonance imaging apparatus according to claim 1, wherein
the imaging conditions include at least one of (i) an imaging region of a patient and (ii) a type of QD coil.

3. The magnetic resonance imaging apparatus according to claim 2, wherein the processing circuitry is further configured to collect elicited magnetic resonance RE signal data while changing at least one of the phase and amplitude parameters from the acquired initial value and to adjust the at least one of the phase and the amplitude based on the collected data.

4. The magnetic resonance imaging apparatus according to claim 3, wherein the processing circuitry is further configured to obtain an index which represents non-uniformity of a radio-frequency magnetic field formed by the QD coil, from the collected data and to adjust the at least one of the phase and amplitude parameters so as to minimize the index.

5. The magnetic resonance imaging apparatus according to claim 4, wherein the collected RF magnetic resonance signal data is adjustment data collected using a spin echo pulse sequence with a flip angle set to be smaller than a typical flip angle for a spin echo pulse sequence.

6. The magnetic resonance imaging apparatus according to claim 4, wherein the collected data is a RF magnetic field map.

7. The magnetic resonance imaging apparatus according to claim 5, wherein the processing circuitry is further configured to enhance a strength variation to the adjustment data.

8. The magnetic resonance imaging apparatus according to claim 6, wherein the processing circuitry is further configured to enhance a strength variation to the RF magnetic field map.

9. The magnetic resonance imaging apparatus according to claim 2, wherein the processing circuitry is further configured to acquire an axial section image of the patient, to determine an angle difference between a specific axis in the axial section image and an actual axis of the patient corresponding to the specific axis as a correction value, and to correct the initial value of the phase stored in the storage device by the correction value.

10. The magnetic resonance imaging apparatus according to claim 3, wherein the processing circuitry is further configured to adjust the at least one of the phase and amplitude parameters so as to minimize forward power of a refocusing RF pulse measured while changing at least one of the phase and amplitude parameters.

11. The magnetic resonance imaging apparatus according to claim 2, wherein the processing circuitry is further configured to adjust at least one of the phase and amplitude parameters based on a first RF magnetic field map collected by RF transmission via the first output channel alone and a second RF magnetic field map collected by RF transmission via the second channel alone.

12. The magnetic resonance imaging apparatus according to claim 11, wherein the processing circuitry is further configured to adjust phase based on an angle formed by maximum uniformity lines extracted from the first RF magnetic field map and the second RF magnetic field map.

13. The magnetic resonance imaging apparatus according to claim 11, wherein the processing circuitry is further configured to adjust amplitude based on a contribution to uniformity of a RF magnetic field of the QD coil, the uniformity having been calculated from the first and second RF magnetic field maps.

14. The magnetic resonance imaging apparatus according to claim 3, wherein the processing circuitry is further configured to adjust an output level of the RF transmit pulse based on at least one of the phase and amplitude being subjected to adjustment.

15. The magnetic resonance imaging apparatus according to claim 14, wherein the processing circuitry is further configured to adjust the output level so as to minimize an index which represents non-uniformity of a RF magnetic field collected by changing the output level.

16. The magnetic resonance imaging apparatus according to claim 14, wherein the processing circuitry is further configured to adjust the output level so as to maximize strength of a magnetic resonance RF signal collected by changing the output level.

17. The magnetic resonance imaging apparatus according to claim 11, wherein the processing circuitry is further configured to adjust an output level of the RF transmit pulse based on at least one of the phase and amplitude being subjected to adjustment.

18. The magnetic resonance imaging apparatus according to claim 17, wherein the processing circuitry is further configured to adjust the output level so as to minimize an index which represents non-uniformity of a RF magnetic field collected while changing the output level.

19. The magnetic resonance imaging apparatus according to claim 17, wherein the processing circuitry is further configured to adjust the output level so as to maximize strength of a magnetic resonance RF signal collected while changing the output level.

20. The magnetic resonance imaging apparatus according to claim 2, wherein the processing circuitry is further configured to acquire at least one of the phase and amplitude parameters of the RF transmit pulse which corresponds to the imaging conditions retrieved from the storage device, and to multiply the acquired parameter(s) by −1 when body position of the patient indicates a lateral recumbent position.

21. The magnetic resonance imaging apparatus according to claim 1, wherein the processing circuitry is further configured to adjust the amplitude after adjusting the phase.

22. The magnetic resonance imaging apparatus according to claim 1, wherein:
the imaging conditions include at least one of (a) an imaging region of the patient and (b) the type of QD coil;
the magnetic resonance imaging apparatus further comprises a storage device configured to store the selectable imaging conditions and at least one of the phase and amplitude parameters of the RF transmit pulse respectively associated with the imaging conditions; and
the processing circuitry is further configured to read at least one of the phase and amplitude parameters of the RF transmit pulse which corresponds to the imaging conditions retrieved from the storage device and to set the read parameter(s) on a transmission channel for output to the QD coil, to thereby adjust at least one of the phase and amplitude of the RF transmit pulse.

23. The magnetic resonance imaging apparatus according to claim 22, wherein the at least one phase and amplitude parameter(s) stored in the storage device is determined so as to minimize an index which represents non-uniformity of a RF magnetic field formed within the QD coil, the index being obtained from magnetic resonance RF data collected while changing at least one of the phase and amplitude of a transmitted RF pulse.

24. The magnetic resonance imaging apparatus according to claim 22, wherein the phase and/or amplitude parameter(s) stored in the storage device is(are) determined based on a first RF magnetic field map collected by RF of transmission via the first output channel alone and a second RF magnetic field map collected by RF transmission via the second output channel alone.

* * * * *